United States Patent
Hwang et al.

(10) Patent No.: US 6,242,313 B1
(45) Date of Patent: Jun. 5, 2001

(54) USE OF POLYSILICON FIELD PLATES TO IMPROVE HIGH VOLTAGE BIPOLAR DEVICE BREAKDOWN VOLTAGE

(75) Inventors: Jei-Feng Hwang, Chu-Pei; Jun-Lin Tsai, Hsin-Chu; Ruey-Hsin Liou, Hsin-Chu; Jyh-Min Jiang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/389,891

(22) Filed: Sep. 3, 1999

(51) Int. Cl.[7] .................................................. H01L 21/331
(52) U.S. Cl. .......................... 438/363; 438/309; 438/335; 438/341
(58) Field of Search ..................... 438/309, 316, 438/335, 341, 353, 362, 363

(56) References Cited

U.S. PATENT DOCUMENTS

| | | | |
|---|---|---|---|
| 4,612,563 | * 9/1986 | Macdougall et al. | 257/310 |
| 4,966,858 | 10/1990 | Masquelier et al. | 437/27 |
| 4,978,630 | 12/1990 | Kim | 437/32 |
| 5,028,557 | 7/1991 | Tsai et al. | 437/59 |
| 5,247,200 | * 9/1993 | Momose et al. | 257/378 |
| 5,589,405 | 12/1996 | Contiero et al. | 437/6 |
| 5,750,414 | 5/1998 | Whitney | 437/154 |

OTHER PUBLICATIONS

Goud, C.B., Bhat, K.N.; Analysis and Optimal Design of Semi–Insulator Passivated High–Voltage Field Plate Structures and Comparison with dielectric Passivated Structures, IEEE Transactions on Electron Devices, vol. 41, No. 10 Oct. 1994, pp. 1856–1865.*

* cited by examiner

Primary Examiner—John F. Niebling
Assistant Examiner—Christopher Lattin
(74) Attorney, Agent, or Firm—George O. Saile; Stephen B. Ackerman

(57) ABSTRACT

A method for fabricating a buried layer pinched collector bipolar, (BPCB), device, sharing several process steps with simultaneously formed CMOS devices, has been developed. The BPCB device fabrication sequence features the use of polysilicon field plates,. placed on field oxide regions, in an area of an N well region in which the field oxide regions are located between subsequent P type, base and N type, collector regions. The use of the polysilicon field plates results in an increase in collector—emitter breakdown voltage, as a result of a reduction in the electric field at the surface underlying the polysilicon field plates. The ability to increase collector —emitter breakdowns, via use of only polysilicon field plates, allows the use of higher N well dopant concentrations, thus resulting in increased frequency responses, (Ft), of the BPCB device, when compared to counterparts fabricated with the lower N well dopant concentrations, where the lower N well dopant concentration is needed to achieve the desired, increased collector emitter breakdowns.

19 Claims, 5 Drawing Sheets

USE OF POLYSILICON FIELD PLATES TO IMPROVE HIGH VOLTAGE BIPOLAR DEVICE BREAKDOWN VOLTAGE

Related Patent Activity —"FIELD RINGS TO IMPROVE THE BREAKDOWN VOLTAGE FOR A HIGH VOLTAGE BIPOLAR DEVICE", by J. F. Hwang, J. L. Tsai, R. H. Liou, K. C. Liu, of Taiwan Semiconductor Manufacturing Corp., Invention Disclosure TSMC99-071, Ser. No. 09/376,428, Aug. 18, 1999, assigned to a common assignee.

BACKGROUND OF THE INVENTION (1) Field of the Invention

The present invention relates to methods used to fabricate semiconductor devices, and more specifically to a method used to increase the collector - emitter breakdown voltage of a high voltage bipolar device.

(2) Description of Prior Art

The use of BiCMOS, (bipolar—complimentary metal oxide semiconductor), semiconductor chips, used to achieve enhanced performance when compared to semiconductor chips fabricated using only CMOS devices, have again focused attention on bipolar devices. Applications demanding high bipolar breakdown voltages, such as the collector— emitter, or the BVceo parameter, have led to the use of a Buried layer Pinched Collector Bipolar, (BPCB), device, in which the collector—emitter breakdown can be as high as about 30 to 40 volts. Additional increases in BVceo can be achieved by deceasing the concentration of an N well region, the region in which the BPCB device is fabricated in, however at the expense of performance, in terms of the frequency response, (Ft), or the device.

This invention will describe a BPCB, bipolar device, in which polysilicon field plates are placed on field oxide regions, which results in a potential shift, which in turn results in a reduction in surface electric field, thus improving, or increasing, the BVceo parameter to a values greater than 50 volts. In addition the use of the polysilicon field plates, presenting improved breakdown characteristics, thus allows higher N well concentrations to be tolerated, thus allowing higher Ft to be realized. The BPCB bipolar device is easily integrated into a conventional CMOS fabrication process, sharing many process steps, thus reducing the complexity of the BiCMOS integrated fabrication procedure. Prior art, such as Contiero et al, in U.S. Pat. No. 5,589,405, as well as Whitney, in U.S. Pat. No. 5,750,414, describe field plates overlying CMOS devices, however not the configuration, or process sequence, used in this novel application, where the polysilicon field plates are placed on field oxide regions, where the field oxide region is located between a base and collector region, resulting in enhanced breakdown characteristics of a BPCB bipolar device.

SUMMARY OF THE INVENTION

It is an object of this invention to fabricate a buried layer pinched collector bipolar, (BPCB), device, and an a CMOS device, using an integrated fabrication sequence.

It is another object of this invention to increase the collector—base breakdown voltage, of the BPCB, bipolar device, via use of polysilicon field plates, placed on field oxide regions, and located overlying a region between the collector and base regions, of the BPCB device.

It is still another object of this invention to increase the Ft of the BPCB bipolar device via use of increased N well dopant concentration.

In accordance with the present invention, a buried layer pinched collector, (BPCB), bipolar device, fabricated simultaneously with CMOS devices, featuring polysilicon field plates, located on field oxide regions, that in turn are located between a base and a collector region of the BPCB device, and used to improve collector - emitter breakdown voltage of the device, is described. After formation of an P type, buried layer region, in a semiconductor substrate, a thick, P type, epitaxial silicon layer is deposited, followed by the creation of an N well region, in an area of the P type, epitaxial silicon layer, to be used for a NPN, BPCB bipolar device. Field oxide regions are next formed followed by the formation of polysilicon field plates, located overlying the field oxide regions. A P type, base region is next formed in an area of the N well region, located between field oxide regions, followed by the creation of an N type, emitter region, formed in a top portion of the P type, base region, and the creation of N type, collector regions, formed in a portion the N well region, adjacent to the outside edges of the field oxide region

BRIEF DESCRIPTION OF THE DRAWINGS

The object and other advantages of this invention are best described in the preferred embodiments with reference to the attached drawings which include.

DESCRIPTION OF THE PREFERRED EMBODIMENTS

The method of fabricating a buried layer pinched collector bipolar, (BPCB), device, along with, and sharing process steps with, CMOS devices, featuring polysilicon field plates, located on field oxide regions, which in turn are located between the base and collector regions of the BPCB device, and used to improve the performance of the BPCB device, will now be described in detail. This invention will be described as an NPN type, bipolar device. However the use of the polysilicon field plates can also be applied to PNP type, buried layer pinched collector bipolar devices via: the creation of a N type, buried layer; the use of a N type, epitaxial layer; the creation of a P well region, in the N type epitaxial layer; the formation of polysilicon field plates on underlying field oxide regions; the creation of an N type base region, in the P well region, located between field oxide regions; and the creation of a P type emitter region, in a portion of the N type base regions, and the creation of P type collector regions.

Figure 1:
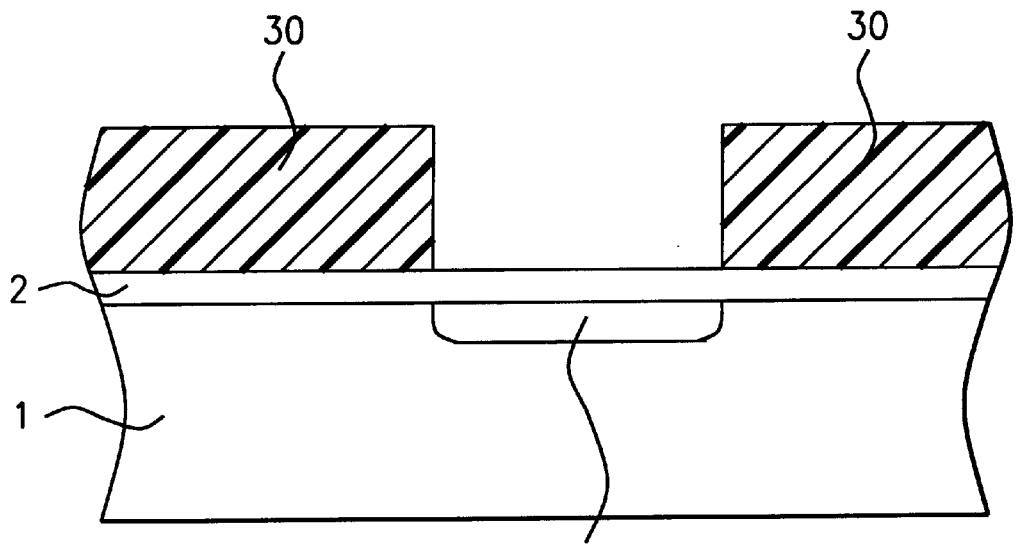
FIGS. 1–6, and 7B, which schematically, in cross-sectional style, describe the fabrication of a buried layer pinched collector bipolar, (BPCB), device, fabricated along with, and sharing process steps of, CMOS devices, and featuring the use of polysilicon field plates, located on a field oxide region, which in turn is located between the base and collector regions of the BPCB device, employed to improve the characteristics of the BPCB device.

A semiconductor substrate 1, comprised of P type, single crystalline silicon, with a <100> crystallographic orientation, is used and schematically shown in FIG. 1. A silicon oxide layer 2, to be used as a screen oxide for a subsequent ion implantation procedure, is thermally grown to a thickness between about 100 to 200 Angstroms. Photoresist shape 30, is then formed and used as a mask to allow an ion implantation procedure, using boron, or $BF_2$ ions, at an energy between about 30 to 50 KeV, and at a dose between about 3E12 to 4E12 atoms/$cm^2$, to create region 3a, comprised of the implanted P type ions. This is schematically shown in FIG. 1.

Figure 2:
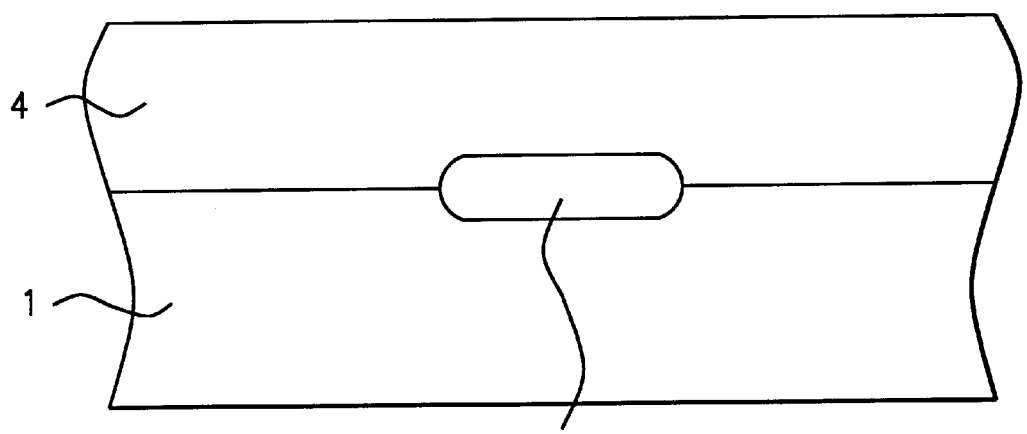

Photoresist shape 30, is then removed via plasma oxygen ashing and wet cleans, followed by the removal of screen oxide layer 2, via the use of a wet, hydrofluoric acid solution. A P type, epitaxial silicon layer 4, is then deposited at a temperature between about 1000 to 1200° C., to a thickness between about 4.4 to 4.6 um, using either silane, or disilane, as a silicon source, with the addition of diborane, to result in a surface concentration for P type, epitaxial silicon layer 4, between about 2.8E14 to 3.0E14 atoms/$cm^3$. The temperature experienced during the growth of P type, epitaxial silicon layer 4, results in the creation of P type buried layer 3b, shown schematically in FIG. 2. P type buried layer 3b, located in a top portion of semiconductor substrate 1, and in a bottom portion of P type, epitaxial silicon layer 4, will improve the collector—emitter breakdown voltages of BPCB devices, but only to a level below about 50 volts, and with a low frequency response, (Ft), as a result of a subsequent, lightly doped N well region, needed for the desired collector—emitter breakdowns. Therefore the remainder of this description will show the introduction of the novel polysilicon field plates, located on field oxide regions, resulting in higher BVceo values, in the range of 50 to 90 volts, even when using higher N well dopant concentrations, and thus allowing a higher Ft, to be achieved.

Figure 3:
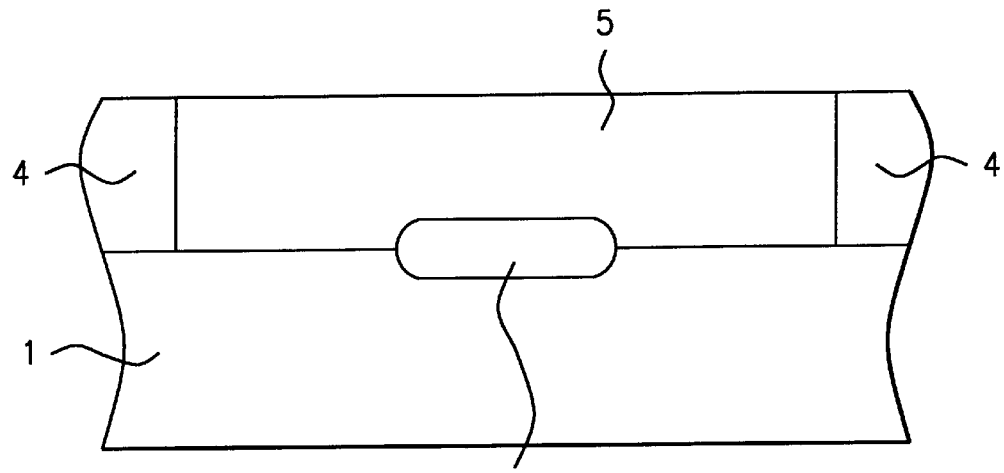

Conventional photolithographic masking procedures are next used to create N well region 5, in semiconductor substrate 1. This is accomplished via an ion implantation procedure, using arsenic, or phosphorous ions, at an energy between about 90 to 110 KeV, and at a dose between about 2E12 to 2.5E12 atoms/$cm^2$. The photoresist shape, not shown in the drawings, used for defnition of N well region 5, which is shown schematically in FIG. 3, is removed via plasma oxygen ashing and careful wet clean procedures. The activation of the implanted ions, of N well region 5, will be accomplished during the formation of subsequent field oxide regions. N well region 5, with a surface concentration between about 4E16 to 6E16 atoms/$cm^3$, is formed simultaneously with the formation of the N well regions of CMOS devices. In addition N well region 5, can comprised with a higher dopant concentration than counterparts, due to the reduction in the electric field at the surface, due to the squeezing of the potential away from the base region, due to the placement of polysilicon field plates, located overlying a field oxide region, which in turn is located between the base and collector regions, therefore still resulting in breakdown voltages usually achieved with lowerr N well dopant concentrations.

Figure 4:
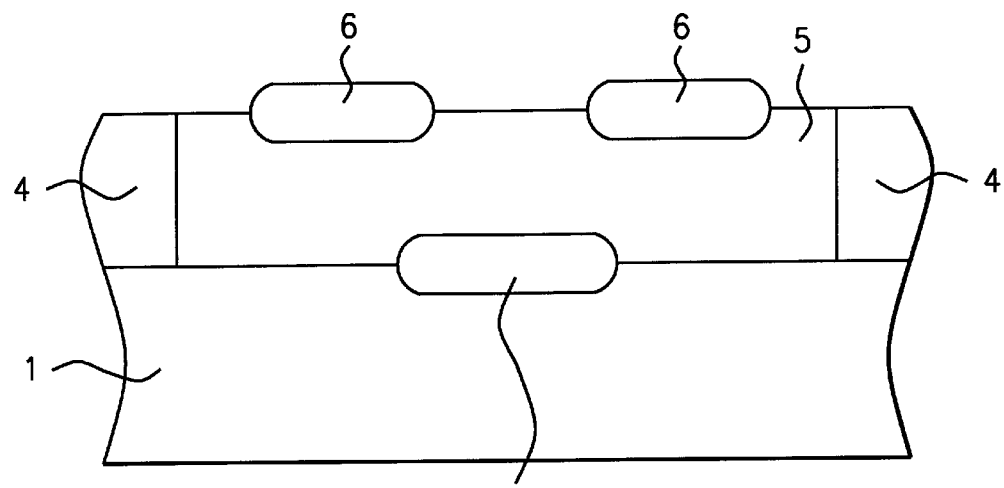

Oxidation resistant shapes, comprised of silicon nitride, are next formed, and used as a mask to allow field oxide regions 6, shown schematically in FIG. 4, to be created. The silicon nitride, oxidation resistant shapes, not shown in the drawings, are formed via deposition of a silicon nitride layer, using low pressure chemical vapor deposition, (LPCVD), or plasma enhanced chemical vapor deposition, (PECVD), procedures, followed by patterning of the silicon nitride layer, via conventional photolithographic and reactive ion etching, (RIE), procedures. The photoresist shape, used to define the silicon nitride, oxidation resistant shapes, are again removed using plasma oxygen ashing and careful wet cleans. A thermal oxidation procedure is then performed, in an oxygen—steam ambient, at a temperature between about 970 to 990° C., creating field oxide, (FOX), regions 6, at a thickness between about 5500 to 6500 Angstroms, in regions of N well region 6, not covered by oxidation resistant, silicon nitride shapes. The temperature experienced during the creation of FOX regions 6, results in the activation of the ions used for N well region 5. The FOX procedure, used for the BPCB device, was also shared with the step used to create the desired isolation regions, for adjacent CMOS devices. The silicon nitride, oxidation resistant shapes, are now selectively removed via use of a hot phosphoric acid.

Figure 5:
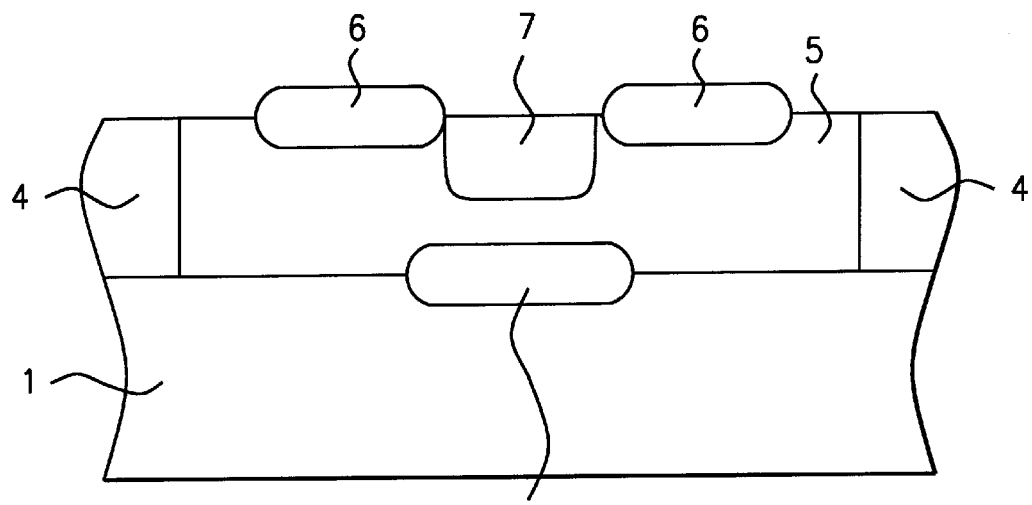

A photoresist shape, not shown in the drawings, is next used as a mask to allow an ion implantation procedure, using either boron or $BF_2$ ions, at an energy between about 35 to 45 KeV, at a dose between about 2.0E13 to 2.4E13 atoms/$cm^2$, to create P type, base region 7, schematically shown in FIG. 5. The surface concentration of P type, base region 7, is between about 1E17 to 2E17 atoms/$cm^3$. The photoresist shape, used to define P type, base region 7, is now removed via plasma oxygen ashing and careful wet cleans.

Figure 6:
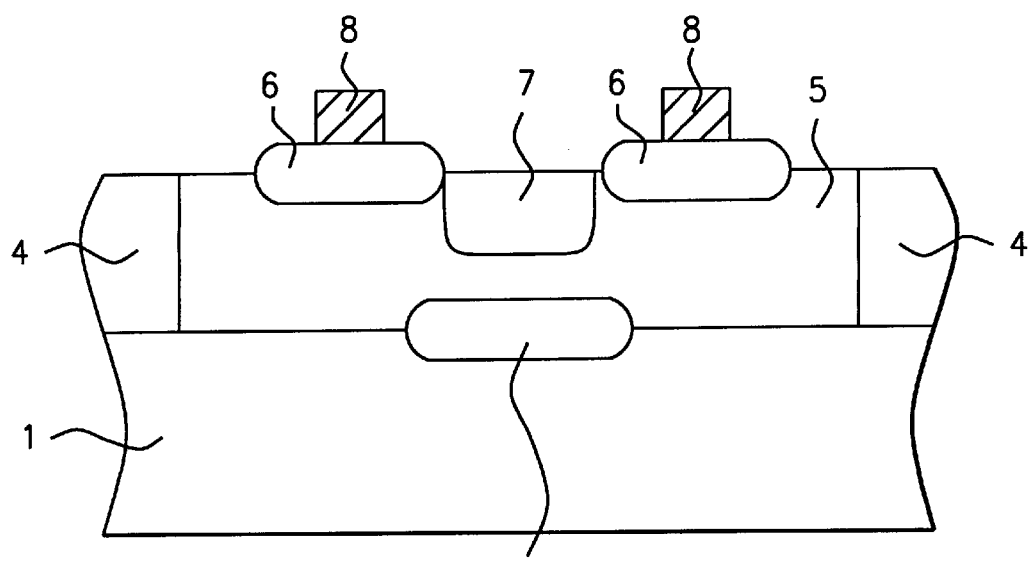
Figure 8:
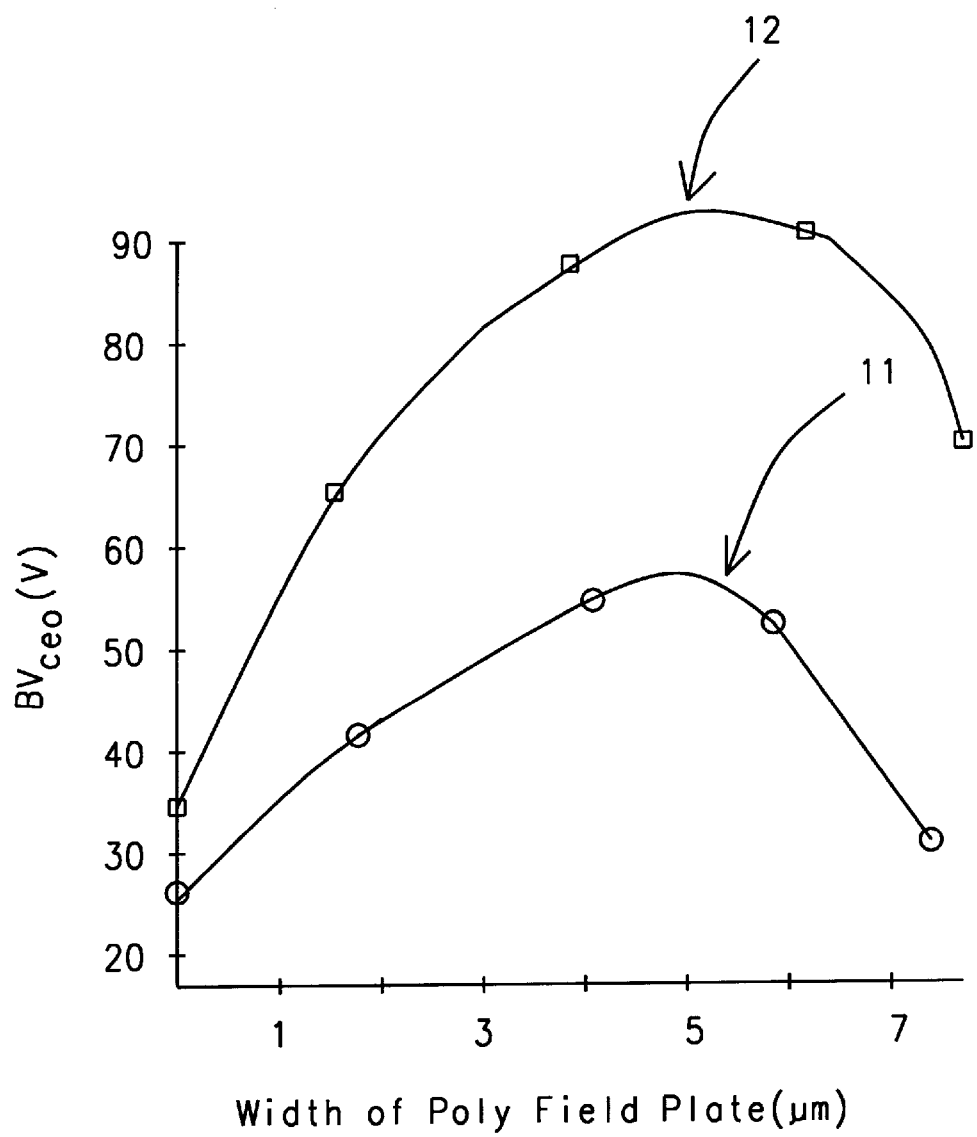
FIG. 8, which shows the relationship of BVceo, of the BPCB device, as a function of the width of the polysilicon field plates, and the relationship of BVceo, as a function of the dopant concentration of the N well region, for a specific polysilicon field plate width

The formation of the novel polysilicon field plates, used to increase the BVceo characteristics of the BPCB device, is next addressed, and shown schematically in FIG. 6. A polysilicon layer is deposited via LPCVD procedures, to a thickness between about 3400 to 3600 Angstroms. The polysilicon layer can be doped in situ, during deposition, via the addition of arsine, or phosphine, to a silane ambient, or the polysilicon layer can be deposited intrinsically, then doped via ion implantation of arsenic, or phosphorous ions. Conventional photolithographic and anisotropic, reactive ion etching, (RIE), procedures, using $Cl_2$, or $SF_6$ as an etchant, are used to create polysilicon field plates 8, shown schematically in FIG. 6. The width of the polysilicon field plates will determine the magnitude of BVceo. This can be observed in FIG. 8, in which BVceo, for BPCB devices, fabricated without polysilicon field plates, with values of 25 to 35 volts, increase to values of 40 to 80 volts, when polysilicon field plates with widths between about 4 to 6 um, are used. The formation of multiple, two or more, polysilicon field plates, on a specific field oxide region can be used to provide the needed polysilicon field plate width, if desired, replacing an individual, wider polysilicon field plate. The photoresist shape, used to define the polysilicon field plates, is again removed using plasma oxygen ashing and careful wet cleans. The polysilicon field plates can be formed simultaneously with the formation of the CMOS polysilicon gate structures.

Figure 7A:
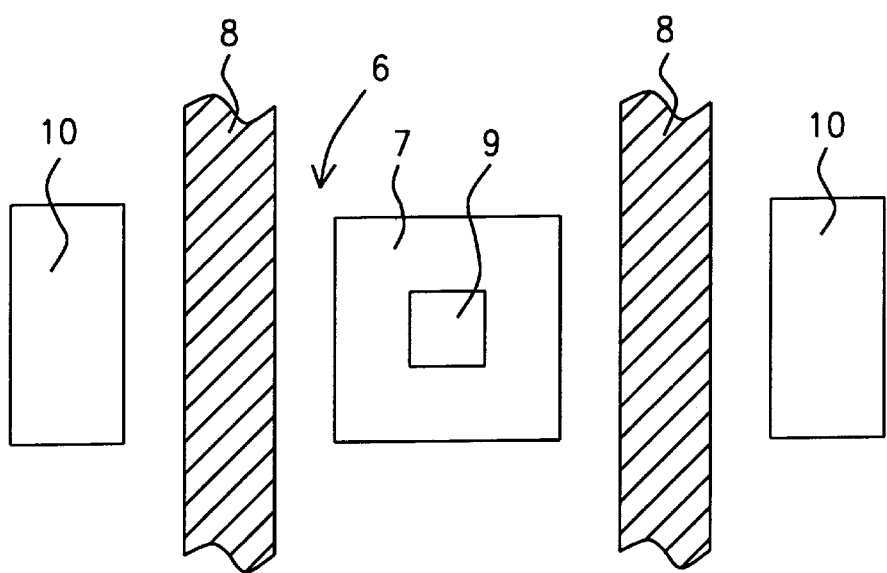
FIG. 7A, which schematically shows a top view of the BPCB device, featuring polysilicon field plates, located on field oxide regions.
Figure 7B:
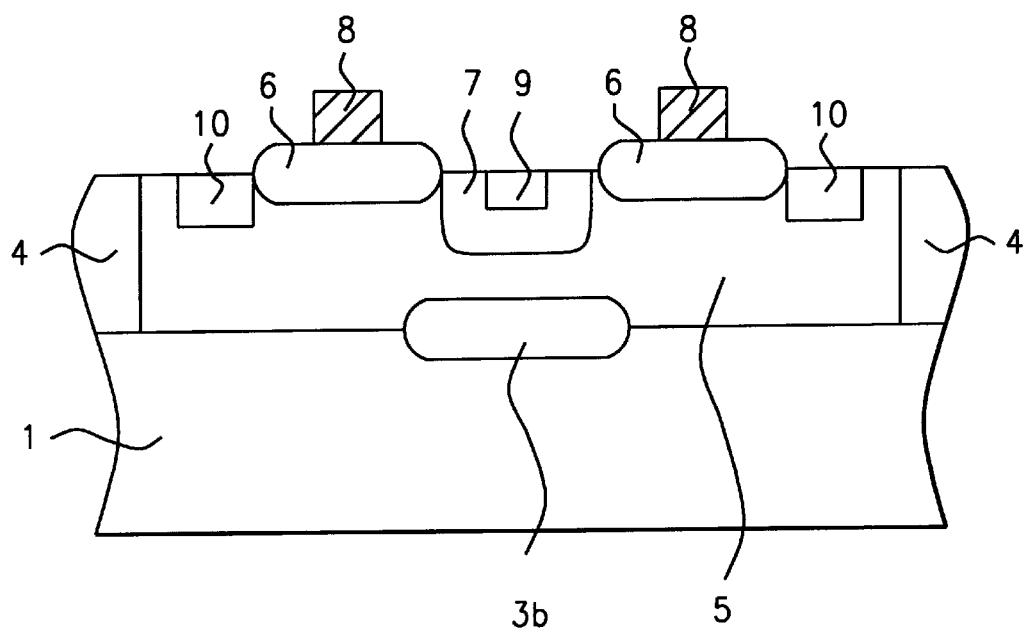

Emitter region 9, and collector regions 10, are next formed and shown schematically, in cross-sectional style, in FIG. 7B, and schematically shown, as a top view in FIG. 7A. A photoresist shape, not shown in the drawings, is used as a mask to allow an ion implantation procedure, using arsenic, or phosphorous ions, at an energy between about 55 to 65 KeV, and at a dose between about 6.4E15 to 6.6E15 atoms/$cm^2$, to create the emitter and collector regions. The ion implantation step used to form the heavily doped, source/drain region, for the CMOS devices, can be used to create collector regions 10, and emitter region 9, for the BPCB device. After removal of the photoresist shape, used for definition of the collector and emitter regions, accomplished again using plasma oxygen ashing and careful wet cleans, an anneal procedure is used to activate the N type ions in collector, and emitter regions 14a, and in emitter ion regions.

The use of the polysilicon field plates, now located overlying the portion of N well region 5, located between P type, base region 9, and N type, collector region 10, squeezes, or pushes, the electric field, at the surface, away from P type, base region 7, in the direction of collector region 10, resulting in an increase in BVceo. The increase in BVceo, obtained without decreasing the N well concentration, in turn allows higher Ft, or frequency response, to be achieved, when compared to devices fabricated with lower N well concentrations. Referring again to FIG. 8, it can be seen that the magnitude of BVceo, shown as curve 12, in FIG. 8, obtained previously with a N well, formed via an ion implantation dose of 2E12 atoms/cm$^2$, without the use of polysilicon field plates, can be achieved or exceeded, using an N well implanted dose of 2.5E12 atoms/cm$^2$, shown as point 11, in FIG. 8, when polysilicon field plates, with a widths greater than 2 um, are used. The ability to use the higher N well concentration, results in the desired increased Ft.

While this invention has been particularly shown and described with reference to, the preferred embodiments thereof, it will be understood by those skilled in the art that various changes in form and details may be made without departing from the spirt and scope of this invention.

What is claimed is:

1. A method of fabricating a buried layer punched collector bipolar, (BPCB), device, on a semiconductor substrate, comprising the steps of:

forming a buried layer region, in a first portion of said semiconductor substrate;

depositing an epitaxial silicon layer, with a portion of said buried layer region, extending into the bottom portion of said epitaxial silicon layer;

forming a well region, in said epitaxial silicon layer, with said well region overlying said buried layer region;

forming field oxide regions in said semiconductor substrate;

forming a polysilicon field plate, or multiple polysilicon field plates, on said field oxide regions;

forming a base region in an area of said well region, located between the inside edges of said field oxide regions;

forming an emitter region, in a top portion of said base region; and;

forming collector regions, in an area of said well region, adjacent to the outside edges of said field oxide regions.

2. The method of claim 1, wherein said buried layer region, is a P type, buried layer, formed via an ion implantation procedure, using boron, or BF$_2$ ions, at an energy between about 30 to 50 KeV, at a dose between about 3E12 to 4E12 atoms/cm$^2$.

3. The method of claim 1, wherein said epitaxial silicon layer, is a P type, epitaxial silicon layer, deposited at a temperature between about 1000 to 1200° C., to a thickness between about 4.4 to 4.6 um, using silane, or disilane as a source, with the addition of diborane, resulting in a surface concentration between about 2.8E14 to 3.0E14 atoms/cm$^3$, for said P type, epitaxial silicon layer.

4. The method of claim 1, wherein said well region, is an N well region, formed via an ion implantation procedure, using arsenic, or phosphorous ions, at an energy between about 90 to 110 KeV, at a dose between about 2.0E12 to 2.5E12 atoms/cm$^2$.

5. The method of claim 1, wherein said field oxide regions are formed to a thickness between about 5500 to 6500 Angstroms, via a thermal oxidation procedure, performed I in an oxygen—steam ambient, at a temperature between about 970 to 990° C.

6. The method of claim 1, wherein said polysilicon field plates are formed from a polysilicon layer, obtained via LPCVD procedures, at a thickness between about 3400 to 3600 Angstroms, and either doped in situ, via the addition of arsine, or phosphine, to a silane ambient, or doped via ion implantation of arsenic, or phosphorous ions, applied to an intrinsically deposited polysilicon layer.

7. The method of claim 1, wherein said polysilicon field plates are formed via an anisotropic RIE procedure, applied to said polysilicon layer, using Cl$_2$ or SF$_6$ as an etchant.

8. The method of claim 1, wherein the width of said polysilicon field plate, or the sum of the widths of said multiple polysilicon field plates, overlying said field oxide region, is between about 4 to 6 um.

9. The method of claim 1, wherein said emitter region, and said collector regions, are N type emitter, and N type collector regions, formed via an ion implantation procedure, using arsenic, or phosphorous ions, at an energy between about 55 to 65 KeV, and at a dose between about 6.4E15 to 6.6E15 atoms/cm$^2$.

10. A method of fabricating a buried layer pinched collector bipolar, (BPCB), device, on a semiconductor substrate, featuring polysilicon field plates, overlying field oxide regions in an area in which the field oxide regions are located between a base and collector region, comprising the steps of:

forming a P type, buried layer region in a portion of said semiconductor substrate;

depositing a P type, epitaxial silicon layer, on said semiconductor substrate, with said P type, buried layer region extending into a bottom portion of said P type, epitaxial silicon layer;

forming an N well region in a portion of said P type, epitaxial silicon layer, with said N well region overlying and contacting said P type, buried layer region;

forming said field oxide regions in first portions of said N well region;

depositing a polysilicon layer;

patterning of said polysilicon layer to form a polysilicon field plate, on a specific field oxide region, or to form multiple polysilicon field plates, on said specific field oxide region;

forming a P type, base region, in a second portion of said N well region, located between inside edges of said field oxide regions;

forming an N type, emitter region, in a top portion of said P type, base region, located between said field oxide regions; and forming N type, collector regions, in third portions of said N well region, located adjacent to the outside edges of said field oxide regions.

11. The method of claim 10, wherein said P type, buried layer region is formed via an ion implantation procedure, using boron, or BF$_2$ ions, at an energy between about 30 to 50 KeV, at a dose between about 3E12 to 4E12 atoms/cm$^2$.

12. The method of claim 10, wherein said P type, epitaxial silicon layer is deposited at a temperature between about 1000 to 1200° C., to a thickness between about 4.4 to 4.6 um, using silane, or disilane as a source, with the addition of diborane, resulting in a surface concentration between about 2.8E14 to 3.0E14 atoms/cm$^3$ for said P type, epitaxial silicon layer.

13. The method of claim 10, wherein said N well region is formed via an ion implantation procedure using arsenic, or phosphorous ions, at an energy between about 90 to 110 KeV, at a dose between about 2E12 to 2.5E12 atoms/cm$^2$.

14. The method of claim 10, wherein said field oxide regions are formed to a thickness between about 5500 to 6500 Angstroms, via a thermal oxidation procedure, performed in an oxygen-steam ambient, at a temperature between about 970 to 990° C.

15. The method of claim 10, wherein said polysilicon layer is obtained via LPCVD procedures, at a thickness between about 3400 to 3600 Angstroms, and either doped in situ, via the addition of arsine, or phosphine, to a silane ambient, or doped via ion implantation of arsenic, or phosphorous ions, applied to an intrinsically deposited, said polysilicon layer.

16. The method of claim 10, wherein said polysilicon field plate, or said multiple polysilicon field plates, are formed via an anisotropic RIE procedure, applied to said polysilicon layer, using $Cl_2$, or $SF_6$, as an etchant.

17. The method of claim 10, wherein the width of said polysilicon field plate, or the sum of the widths of said multiple polysilicon field plates, overlying a specific field oxide region, is between about 4 to 6 um.

18. The method of claim 10, wherein said P type, base region is formed via an ion implantation procedure, using boron, or $BF_2$ ions, at an energy between about 35 to 45 KeV, and at a dose between about 2.0E13 to 2.4E13 atoms/$cm^2$.

19. The method of claim 10, wherein said N type, emitter region, and said N type, collector regions, are formed via an ion implantation procedure, using arsenic, or phosphorous ions, at an energy between about 55 to 65 KeV, and at a dose between about 6.4E15 to 6.6E15 atoms/$cm^2$.

* * * * *